United States Patent
Mahant-Shetti et al.

(10) Patent No.: US 6,307,495 B1
(45) Date of Patent: Oct. 23, 2001

(54) RESISTOR ELEMENTS IN A RESISTOR DIVIDER DIGITAL-TO-ANALOG CONVERTER

(75) Inventors: Shivaling S. Mahant-Shetti, Garland; John W. Fattaruso, Dallas, both of TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/292,062

(22) Filed: Apr. 14, 1999

Related U.S. Application Data

(60) Provisional application No. 60/082,978, filed on Apr. 24, 1998.

(51) Int. Cl.[7] .................................................. H03M 1/78
(52) U.S. Cl. .................................................. 341/154
(58) Field of Search .................................. 341/144, 154

(56) References Cited

U.S. PATENT DOCUMENTS 4,804,940 * 2/1989 Takigawa et al. .................. 341/154
4,929,923 * 5/1990 Dharmadhikari .................. 338/308

* cited by examiner

*Primary Examiner*—Howard L. Williams
(74) *Attorney, Agent, or Firm*—Dwight N. Holmbo; Wade James Brady, III; Frederick J. Telecky, Jr.

(57) ABSTRACT

A conducting path with a path meander provides a precision voltage-dividing circuit. At each location wherein a voltage level is to be established, the conducting path has an expanded region called a junction region. The centers of all junction regions are equidistant from the centers of neighboring junction regions. Junction regions are positioned at predetermined intervals along the straight portions of the conducting path and at each corner of the path meander. Each junction region has a metal patch extending therefrom. The metal patches are coupled to conducting plugs that, in turn, can be coupled to switching elements of a digital-to-analog converter unit. The junction regions can be altered to increase the precision of the voltage-dividing circuit. Because the junction regions are equidistant from the neighboring junction regions, a cell that includes the switching elements can have a square geometry.

15 Claims, 6 Drawing Sheets

RESISTOR ELEMENTS IN A RESISTOR DIVIDER DIGITAL-TO-ANALOG CONVERTER

This application claims benefit of provisional application No. 60/082,978, filed Apr. 24, 1998.

BACKGROUND OF THE INVENTION

1. Field of the Invention

This invention relates generally to integrated circuit digital-to-analog converter units that are based on voltage-dividing resistor chains. Addressing logic, responsive to a digital input word, selects a metal-oxide-semiconductor (MOS) switch. The selected switch has an input terminal coupled to a position on the voltage-dividing circuit chain, the selected position having a voltage level corresponding to the digital input word. The selected switch applies the voltage from the voltage dividing chain to an output terminal. This structure is used in FLASH digital-to-analog converters and in system architectures incorporating FLASH digital-to-analog converters.

2. Description of the Prior Art

A schematic circuit diagram of a digital-to-analog converter 10 is shown in FIG. 1. A series of resistors 11' provides a voltage-dividing resistor chain 11. The resistor chain 11 provides a sequence of voltage levels between the resistors of the resistor chain. Switches 12 are positioned between each voltage level determined by the resistor chain and an output terminal 15. A decoder unit 13 has a digital input signal group (or word) applied thereto. The decoder unit 13 provides an activation signal to the selected switch 12 having a voltage level applied to its input terminal that corresponds to magnitude of the digital input signal. The selected switch 12 applies this input voltage level to the output terminal 15 of the digital-to-analog converter unit. In this manner, a digital input signal is converted to a(n analog) signal voltage level $V_{OUT}$ corresponding to the input digital signal word.

Integrated circuit digital-to-analog converter units responsive to a small number of logic bits, such as 4 or 5 bits, can implement the resistor chain with a single straight path. The resistor elements are typically fabricated using poly-silicon or metal lines. However, when the digital-to-analog converter unit is responsive to a large number of digital bits, the implementing structure is similar to integrated circuit memory units. A two- or three-dimensional decoding structure can then be used to access the switch coupled to the voltage level corresponding to the digital input word. This digital-to-analog converter array requires a resistor path (or chain) that is laid out in a parallel, back-and-forth path generally referred to as the meander. Because the voltage-dividing chain requires a large number of resistive elements, the total length of the resistive path is long. A metal path is the best material choice for the implementation of a voltage-dividing chain with moderate power consumption and good frequency response.

The linearity of the digital-to-analog converter unit transfer characteristics relies on the uniformity of all the resistive elements forming the voltage-dividing chain. The resistive elements in each lateral straight run of the meander must be similar to the elements that result in the reversal of the meander path. One possible approach to this problem has been described in U.S. Pat. No. 5,534,862. This approach of this reference is to insure that every cell in the voltage divider chain and switch access point (straight run cells and endpoint cells) contains at least one right-angle bend in the metal trace forming the resistor chain. The direction reversal is then accomplished with relatively small resistor error by reorientation of the bend in the path. The cell area needed to implement this approach is larger than necessary because of process design rules for the fabrication of this converter unit structure. However, the size of the array should be minimized because the process gradients of material thickness and etching will result in resistor element mismatch from one side of the array to the other. This mismatch resulting in the overall integral non-linearity (INL) of the digital-to-analog converter will be improved if the array size can be reduced.

A need has therefore been felt for a voltage-dividing network for use with an integrated circuit digital-to-analog converter unit in which the each resistive element in the voltage-dividing network has substantially the same (resistive) value. The voltage-dividing network should provide the highest density of cells (that include the switching elements) and consequently, the minimum area in the integrated circuit for the digital-to-analog converter unit.

SUMMARY OF THE INVENTION

The aforementioned and other features are accomplished, according to the present invention, by providing a voltage-dividing network that permits the array of switches coupled thereto to have a square geometry. The voltage-dividing network includes a resistive path having expanded or junction regions at locations along the path where the voltage levels are established. The expanded or junction regions are positioned at corners of the path meander and at positions on the non-corner or straight portions of the resistive path. These expanded or junction regions provide a chain of elements that have an equal resistance to the first approximation. In the preferred embodiment, the junction regions on voltage-dividing circuit provide the precision voltage levels for a digital-to-analog converter unit. The voltage levels on the resistive path can be made equal to a higher precision by providing trim portions on the expanded junction regions on the resistive path. The square geometry of the cells permits the voltage-dividing network and the associated switching elements to occupy a minimum area on the integrated circuit substrate.

These and other features of the present invention will be understood upon the reading of the following description in conjunction with the Figures.

DESCRIPTION OF THE PREFERRED EMBODIMENT(S)

DETAILED DESCRIPTION OF THE DRAWINGS

Figure 1:
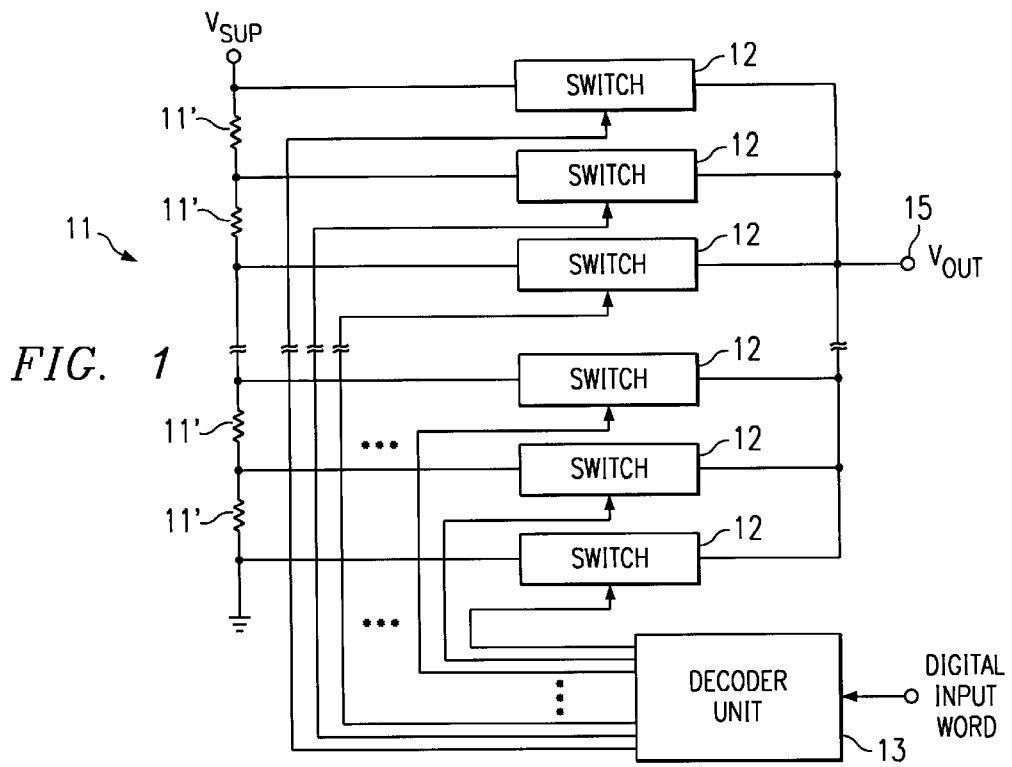
FIG. 1 is a schematic circuit diagram of a digital-to-analog converter.

FIG. 1 has been discussed with in relationship to the prior art.

Figure 2:
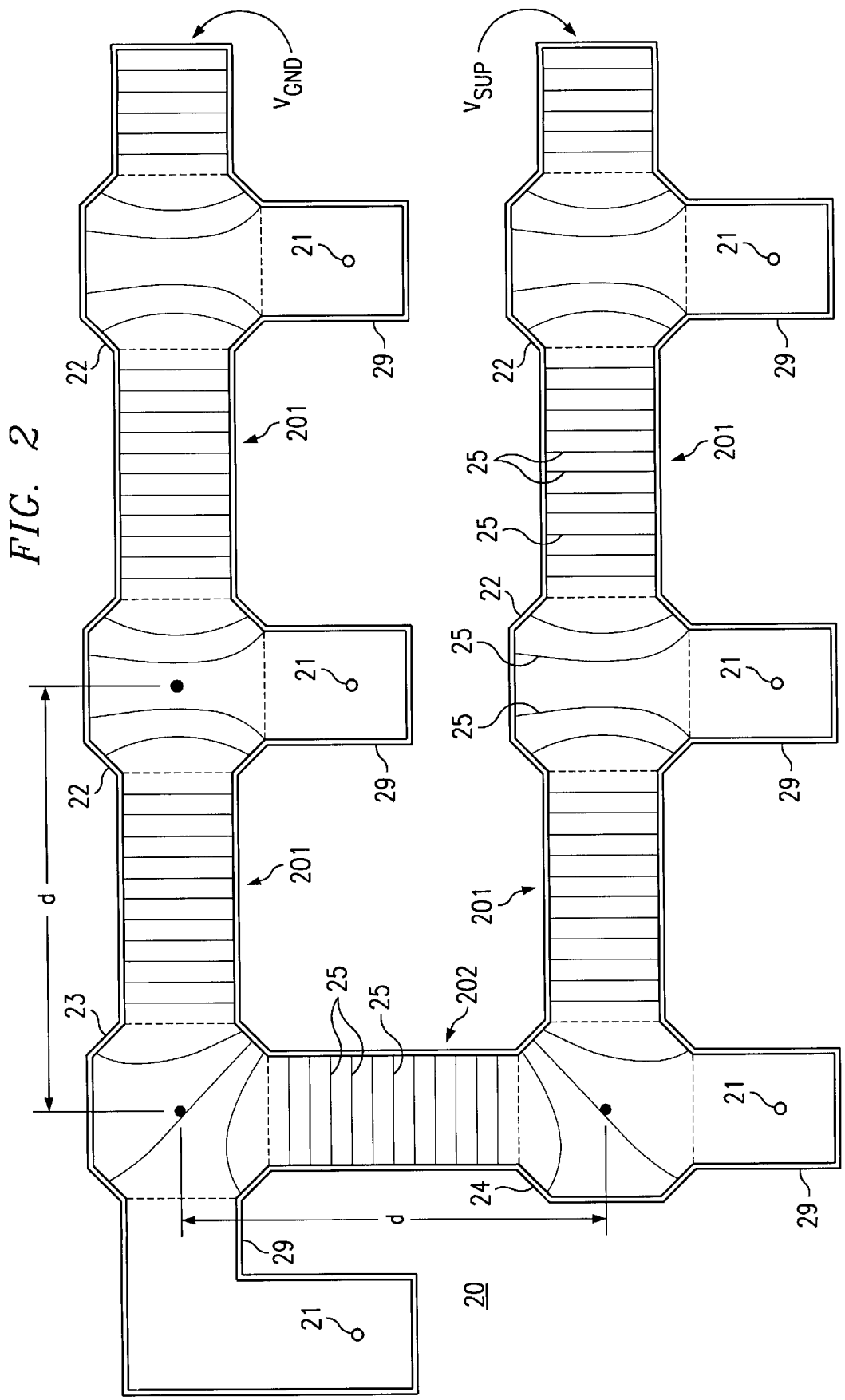
FIG. 2 illustrates the geometry of a resistive path for use as a voltage-dividing network in an integrated circuit, digital-to-analog converter unit according to the present invention.

Referring next to FIG. 2, the implementation of a precision voltage-dividing resistor chain in an integrated circuit, according to the present invention, is shown. The voltage levels determined by the voltage levels at the conducting plugs 21 positioned proximate the path of resistive material 20. The conducting plugs 21 are coupled to the path of resistive material 20 by a metal patch 29. Associated with each conducting plug 21 is a junction region (22, 23, or 24) on the path of resistive material. In the preferred embodiment, the junction regions (22, 23, and 24), as indicated by the dotted lines in FIG. 2, extend beyond the normal boundaries of the resistive path 20 and beyond the metal patches 29 to complete a generally elongated octagonal structure (22, 23, and 24). The elongated octagonal structures (22, 23, and 24) are oriented in the same direction, i.e., perpendicular to the path of conducting material at the non-corners. This structure is illustrated by the dotted lines in FIG. 2. The voltage difference between each of the conducting plugs 21 is also included in FIG. 2 for a potential of 1 volt applied across the voltage-dividing network. The equipotential lines are indicated in FIG. 2 by the lines 25.

Figure 3:
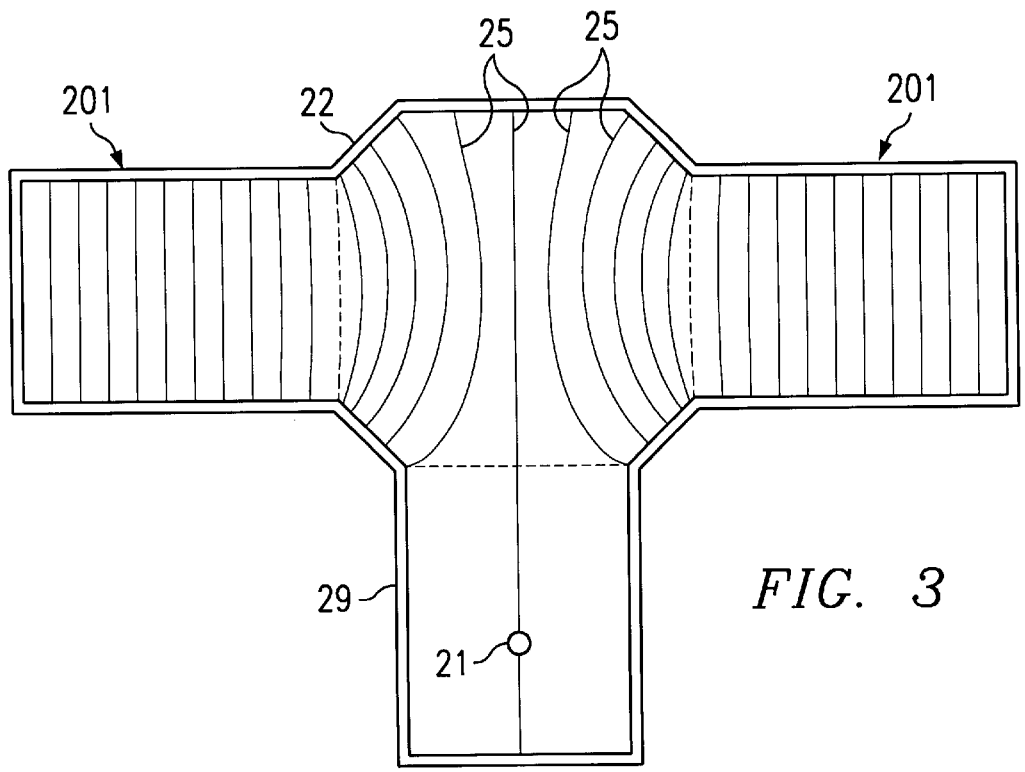
FIG. 3 illustrates the geometry of a junction region coupling a metal patch to the resistive path at non-corner positions of an integrated circuit, voltage-dividing network according to a preferred embodiment of the present invention.
Figure 4:
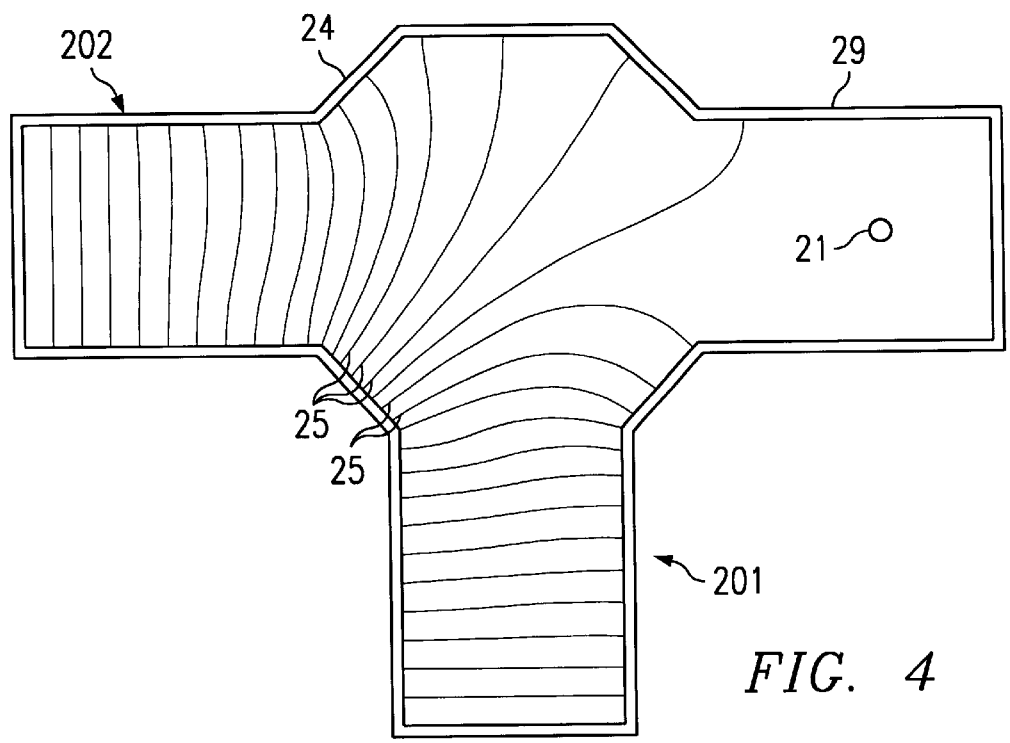
FIG. 4 illustrates the geometry for a first corner junction region coupling a metal patch to the resistive path of voltage-dividing network according to a preferred embodiment of present invention.
Figure 5:
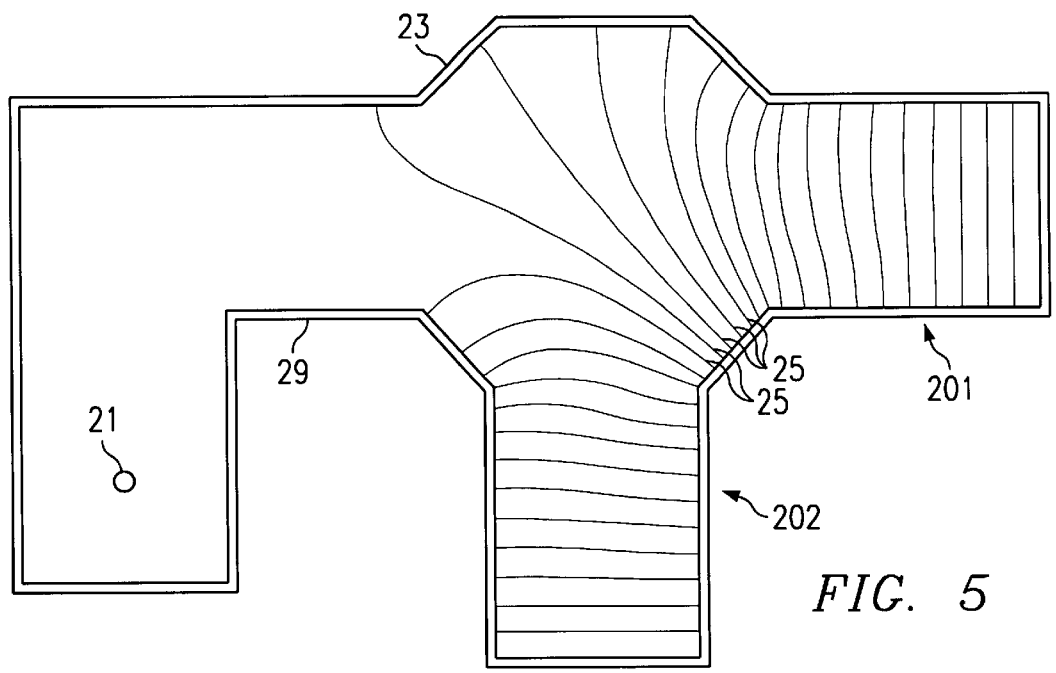
FIG. 5 illustrates the resistive path geometry for a second corner region coupling a metal patch to the resistive path of voltage-dividing circuit according to a preferred embodiment of the present invention.

Referring next to FIG. 3, FIG. 4, and FIG. 5, enlarged illustrations of the non-corner junction region 22, the first corner junction region 23, and the second corner junction region 24, respectively, are shown. Each Figure also includes the equipotential lines 25. Referring once again to FIG. 3, FIG. 4, and FIG. 5, in the preferred embodiment, the octagonal junction regions have two opposing first sides determined by the width of the conducting path. Two opposing second sides, perpendicular to the first sides have a dimension determined by the width of the metal patch 29. The remaining four sides intersect the sides of the metal patches 29 and the conducting path 20 at an angle of approximately 45°. The non-boundary portions of the octagonal structures are indicated by dotted lines in FIGS. 3, 4, and 5.

Figure 6:
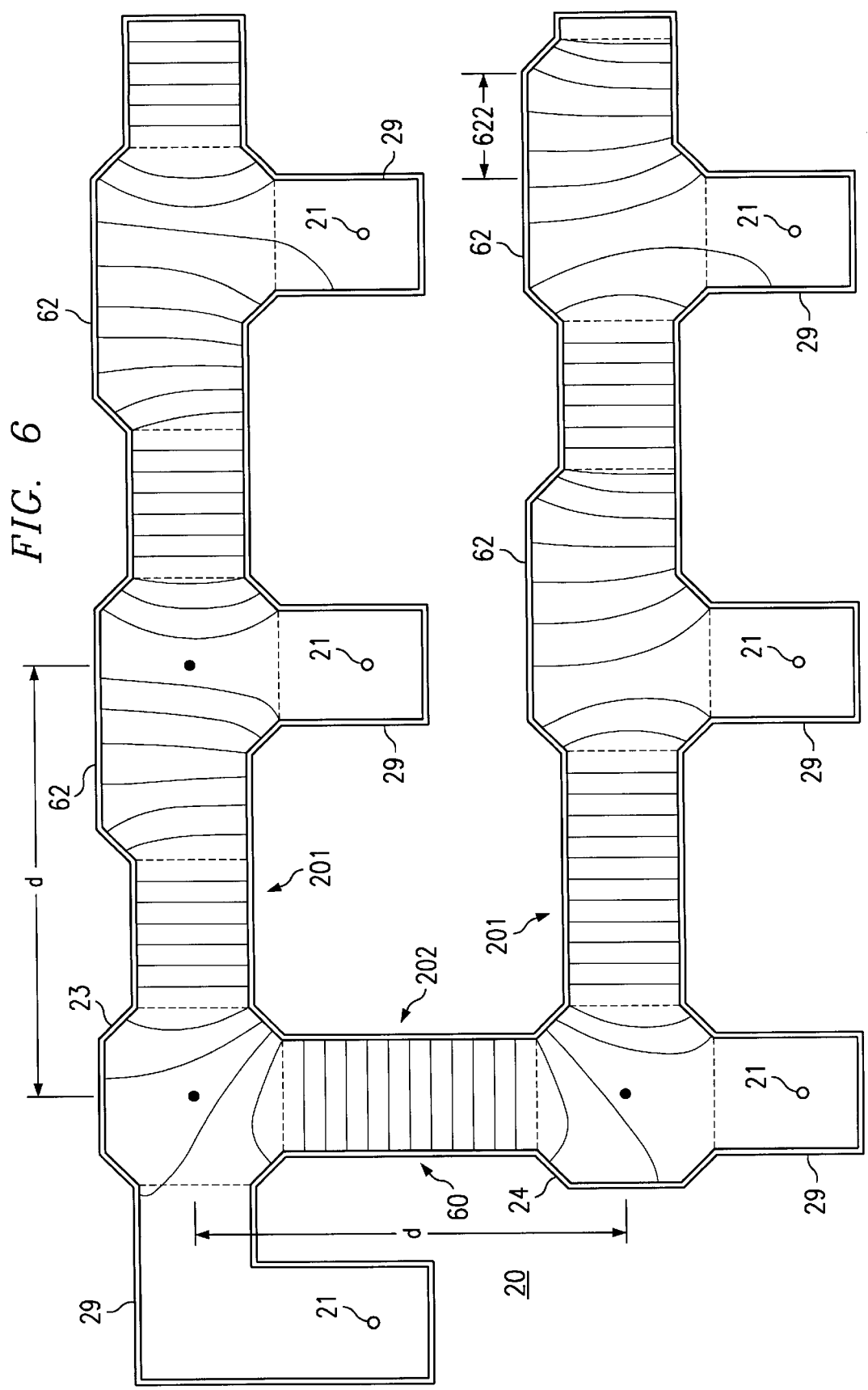
FIG. 6 illustrates the resistive path geometry for an integrated circuit voltage-dividing circuit that provides improved precision when compared to the voltage divider circuit of FIG. 2 according to the present invention.

Referring next to FIG. 6, an improved voltage-dividing circuit 60 is shown. In FIG. 6, the non-corner junction regions 62 have the portion extending from the path of conducting material 201, on the boundary opposite the metal patch 29, is elongated. The potential difference between the conducting plugs is shown for comparison with the voltage differences in FIG. 2 for a potential of 1 volt applied across the voltage-dividing network.

Figure 7:
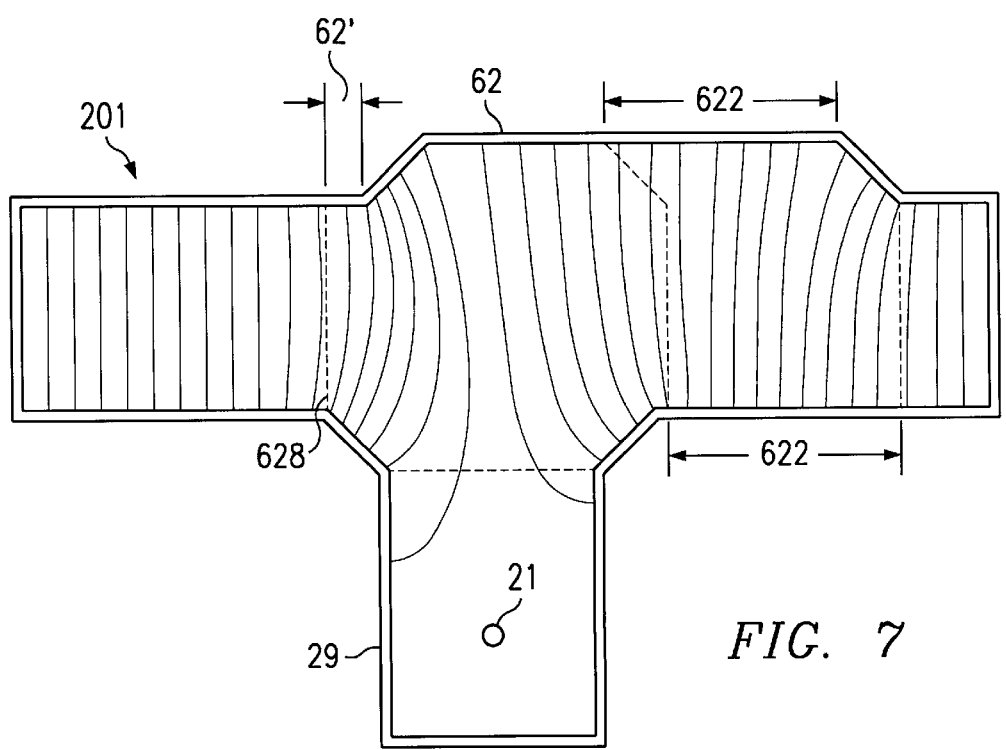
FIG. 7 illustrates the geometry for an improved non-corner junction region coupling a metal patch to the resistive path for a voltage-dividing circuit according to the present invention.

Referring next to FIG. 7, an expanded non-corner junction region 62 of the voltage divider circuit of FIG. 6 is shown. The dotted lines illustrate the differences between junction regions 62 and junction regions 22 (i.e., of FIGS. 2 and 3). The octagonal region 62 has been off-set by a length 621 and has been expanded by a distance 622, both changes occurring on the boundary of the path 201 opposite the metal patch 29. The equipotential lines have been included. The inclusion of the equipotential lines illustrates that the non-corner junction region has a slightly reduced resistance.

Figure 8:
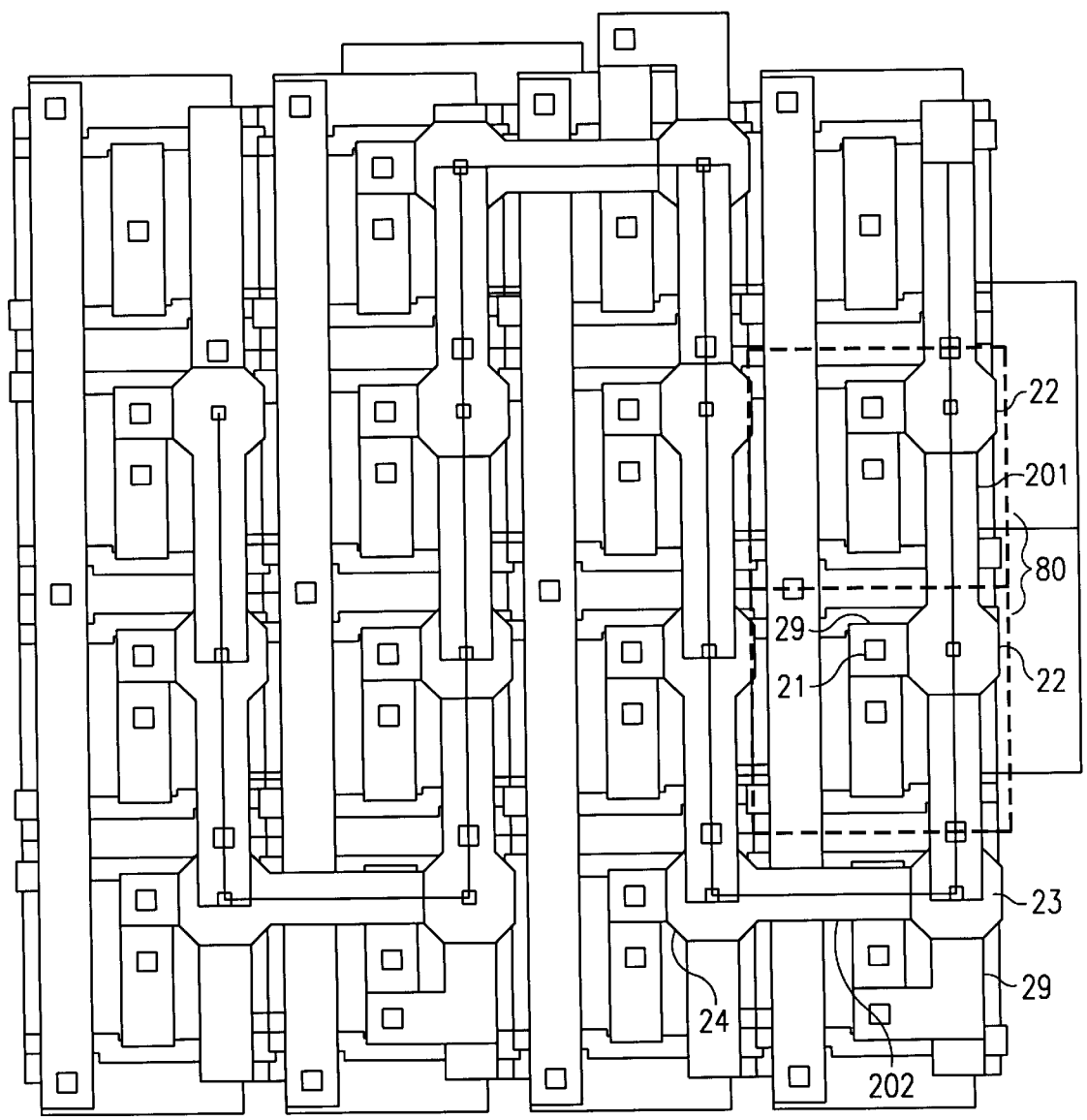
FIG. 8 is planar view of the metal paths, including the voltage-dividing circuit conducting path, in an integrated circuit according to the present invention.

FIG. 8 is a plan view of a 16-element voltage divider circuit 20 shown in FIG. 2. The squares 21 illustrate the locations at which the voltage-dividing circuit is coupled through the metal patches 29 to the contact plugs and, consequently, to the MOS access gates. The metal patches 29 are coupled to the junction regions 22 along the path of conducting material 20 (i.e., 201 and 202) subsequently to the MOS access gate address lines. Although only 16 cells are shown in FIG. 2, this approach is appropriate for digital-to-analog converters with 256–65536 cells (i.e., 8–16 logic bits signals). FIG. 8 also illustrates an important advantage of the present invention. The implementation of the resistor chain by the method disclosed herein permits the cells 80 to have a square geometry.

Figure 9:
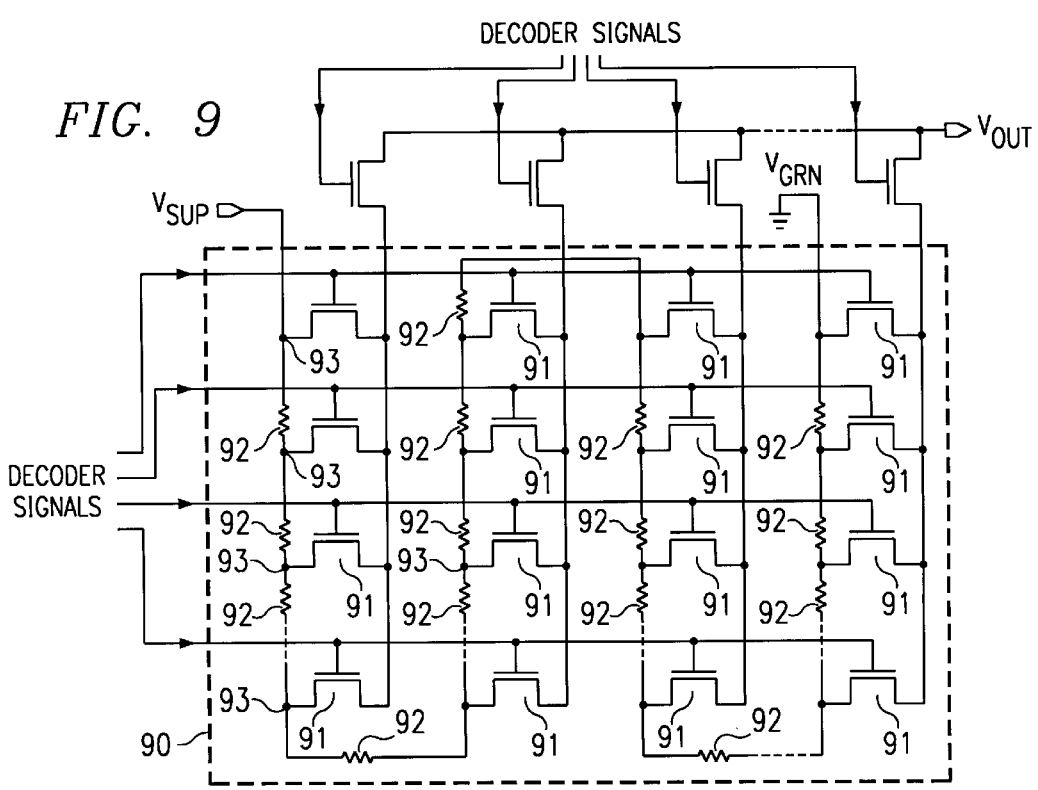
FIG. 9 is a schematic circuit diagram of the integrated circuit shown in FIG. 8.

FIG. 9 is a schematic circuit diagram of the type of resistor chain and associated semi-conductor switching devices that can be implemented by the integrated circuit techniques of the type illustrated by FIG. 8. The portion of the digital-to-analog circuit shown in box 90 includes a resistor chain having series of equal resistors 92 (corresponding to section 201 of the resistive path in FIG. 8) and a multiplicity of transistor switching devices 91 (that would not be visible in the plan view of FIG. 8. The connection 93 of the resistors 92 of the resistor chain to the switching devices 99 is implemented by plug 21 in FIG. 8. The geometry of the conducting path that implements the chain of resistors permits the transistor switching device and associated portions of the resistor chain to be contained within a square cell.

OPERATION OF THE PREFERRED EMBODIMENT(S)

The present invention provides a voltage-dividing circuit that can be implemented as part of an integrated circuit. The voltage-dividing circuit is implemented as a conducting path resistor chain. Compared to the prior art resistor chains, the voltage-dividing can be fabricated in such a manner as to provide a smaller cell size for the integrated circuit elements associated with the converter unit. The smaller size is accomplished by providing enlarged regions in the conducting path at the locations wherein the voltage levels are established. Therefore, additional locations are available establishing voltage levels. These enlarged regions are positioned both along the straight portions of the conducting path and at the corner regions of the conducting path meander. By having the voltage levels at both corner and non-corner positions, the necessity for the equality of the physical configuration of the conducting path between locations establishing the voltage levels is removed and the size of the conducting path can be reduced.

The corner junction region provides a lower resistance than a non-corner junction region. Computer simulations indicate that this difference is approximately 5.8%. In order to provide a smaller resistance for the non-corner junction regions, these junction regions are expanded as shown in FIG. 7. A comparison of the voltage differences between the conducting plugs, shown in FIG. 2 and in FIG. 6, indicates that the linearity of the resistance chain has been improved by this change.

In the foregoing description, the basic junction regions have been described with a particular geometric shape, i.e., a generally octagonal structure. The diagonal sides of the octagonal structure generally form an angle of 45° with the sides of the conducting path. As will be clear to those skilled in the art, the junction regions serve to provide a more symmetric and less critical voltage profile in the region of the metallic patches. This purpose can be accomplished by other geometrical structures, such as squares, and can be a function of the width and thickness of the path of conducting material. The octagonal configuration is particularly convenient, as seen by comparison between FIG. 3 and FIG. 7, for trimming the junction regions and increasing the precision of the differences between voltage levels. It will also be clear to those skilled in the art that what are shown as sharp and distinct angles of the conducting path will be rounded in the resulting device as a result of limitations in the fabrication techniques.

While the invention has been described with particular reference to the preferred embodiment, it will be understood by those skilled in the art that various changes may be made and equivalents substituted for elements of the preferred embodiment without departing from the invention. In addition, many modifications may be made to adapt a particular situation and material to a teaching of the present invention without departing from the essential teachings of the present invention.

As is evident from the foregoing discussion, certain aspects of the invention are not limited to the particular details of the examples illustrated, and it is therefore contemplated that other modifications and applications will occur to those skilled in the art. It is accordingly intended that the claims shall cover all modifications and applications as do not depart from the spirit and scope of the invention.

What is claimed is:

1. A voltage-dividing network for use with an integrated circuit, said voltage-dividing circuit comprising:
   a path of conducting material having straight path portions connected by corner path portions, said path further including:
      expanded first regions on said straight portions of said path; and
      expanded second regions on said corner portions of said path of conducting material, said expanded first regions and second regions providing voltage levels for said voltage-dividing circuit, wherein each expanded first region combines with a respective expanded second region to have an octagonal geometry.

2. The voltage-dividing network of claim 1 wherein neighboring expanded regions are separated by a preselected distance distance.

3. The voltage-dividing network of claim 2 wherein said voltage-dividing network is suitable for use with an integrated circuit having square standard cells.

4. The voltage divider network of claim 1 wherein said expanded first regions have an extended portion on a first side of said conducting path.

5. A integrated circuit digital-to-analog converter unit, said unit comprising:
   a decoder unit responsive to control signals for generating control signals;
   a multiplicity of switches response to said control signals; and
   a voltage-dividing network of the type described in claim 1, wherein each expanded location is coupled to a one of said switches.

6. A method for providing an equal resistance between a multiplicity of locations on a conducting path, said conducting path having straight portions connected by corner portions, said method comprising the steps of:
   providing an expanded portion on said conducting path at each location within said multiplicity of locations, wherein each of said corner portions is at one of said multiplicity of locations, and wherein each expanded portion is provided with an octagonal geometry.

7. The method of claim 6 wherein said providing step includes the step of positioning each of said multiplicity of locations an equidistant from a neighboring one of said multiplicity of locations.

8. The method of claim 6 wherein said providing step includes the step of providing each expanded portion of a straight conducting path location with at least one subportion extending along said conducting path.

9. The method of claim 8 wherein said subportion reduces the resistance of expanded portion.

10. The method of claim 6 further including the step of:
    providing each expanded portion with a conducting patch, said conducting patch for electrical coupling with conducting plug.

11. A path of conducting material for providing a series of equal resistances between preselected locations along said conducting path, said path having straight portions and corner portions; said path comprising:
    a plurality of expanded portions positioned on said straight portions of said path; and
    expanded portions positioned on said corner portions of said path, wherein each expanded portion on said straight portions combines with a respective expanded portion on said corner portions to have the shape of an octagon.

12. The path of claim 11 wherein each of said expanded portions are positioned equidistant from neighboring expanded portions.

13. The path of claim 11 wherein expanded portions on straight portion of said conducting path has subportion extending along said path.

14. The path of claim 11 further including a conducting patch extending from each conducting portion for electrical coupling to conducting paths.

15. The unit of claim 14 wherein said switches are positioned in a square standard cell.

* * * * *